Nov. 24, 1970 W. H. ORR 3,542,654

PROCESS OF MAKING AN RC CIRCUIT AND CALIBRATING SAME

Filed Sept. 16, 1966 5 Sheets-Sheet 1

INVENTOR
W. H. ORR
BY
Charles E. Graves
ATTORNEY

Nov. 24, 1970 W. H. ORR 3,542,654

PROCESS OF MAKING AN RC CIRCUIT AND CALIBRATING SAME

Filed Sept. 16, 1966 5 Sheets-Sheet 4

United States Patent Office 3,542,654
Patented Nov. 24, 1970

3,542,654
PROCESS OF MAKING AN RC CIRCUIT AND CALIBRATING SAME

William H. Orr, Allentown, Pa., assignor to Bell Telephone Laboratories, Incorporated, Murray Hill, N.J., a corporation of New York Filed Sept. 16, 1966, Ser. No. 579,953
Int. Cl. C23b 5/48, 9/00
U.S. Cl. 204—15 10 Claims

ABSTRACT OF THE DISCLOSURE

This disclosure describes a basic method for precise frequency response adjustment of a thin film distributed RC structure, and sets forth typical structures produced in accordance with the invention which exhibit the desired characteristics.

This invention relates to thin film structures and more particularly to a novel thin film distributed RC structure and method of adjusting very precisely the circuit characteristic thereof.

For some applications, thin film distributed RC networks are preferred over networks of individual film resistors and capacitors. It is possible, for example, to synthesize in one distributed network a complete circuit function which otherwise would require many discrete resistors and capacitors. The synthesized circuit is smaller, more reliable and less expensive. Also, the distributed networks do not have the problem of parasitics exhibited by lumped networks at frequencies above approximately $10^6$ Hz.

One of the well-known advantages of conventional or "lumped" thin film RC networks is the relative ease of adjusting their frequency response to within very tight tolerances by trim anodization of the film resistors. This technique is described, for example, in "The Computer Design and Precision Turning of Thin Film Filters," by W. H. Orr, Third Annual Seminar on Integrated Circuits, IEEE, 1966, pages 45–46. A frequency response tolerance of a few hundredths of a percent can be obtained even though the capacitor fabrication tolerance is as high as a few percent.

The anodization technique is not readily applicable, however, to the typical thin film distributed RC network in which a film capacitor is superpositioned on top of a film resistor. As a consequentce, precision adjustment of this network's frequency response heretofore has not been achieved with ease or consistency, since the capacitor counterelectrode prevents trim anodization of the underlying resistor.

The methods heretofore used for producing a precise RC product in a thin film distributed RC network yield under the best conditions a 1 percent tolerance in frequency response. The causative factors, analyzed below, will aid in understanding the later-described advantages of the present invention.

Considering a simple rectangular distributed RC network comprising an oxygen doped resistor film and a tantalum oxide dielectric layer, the open circuit voltage transfer function is:

$$\frac{V_{out}}{V_{in}}=\operatorname{sech}(j\omega RC)^{1/2}$$

when the capacitor counterelectrode is the common ground terminal, and R and C are the total resistance and capacitance of the network. The values of R and C are determined by the sheet resistance $r$, the capacitance density $c$, and the pattern geometry. Where $l$ and $w$ are the length and width of the resistor path, $$R=r\frac{l}{w}$$

and $$C=clw$$

As $w$ does not appear in the RC product, the precise control of this quantity is not critical. The capacitor dielectric is formed by anodizing the top portion of the original resistor film; hence, the values of $r$ and $c$ are interrelated and depend on the properties of the initial deposit. Thus, $$c=\epsilon_0\frac{\epsilon}{t_c}$$

where $\epsilon_0$ is a constant (approximately 0.0885 picofarads/cm.), $\epsilon$ is the dielectric constant of the dielectric layer and $t_c$ is its thickness. Further, $$r=\frac{p}{t_r}$$

where $p$ is the specific resistivity of the resistor film and $t_r$ is its thickness.

If V is the anodization voltage, $K_c$ is the dielectric film anodization constant or increase in dielectric thickness per volt, $K_r$ is the resistor film anodization constant or decrease in resistor film thickness per volt, and $t_0$ is the original resistor film thickness, then $$t_c=K_cV$$

and $$t_r=t_0-K_rV$$

Now, if during the production of the network, V is chosen to provide the design capacitance density $c$, then the control of $\epsilon$ and $t_c$ are such that the proper $c$ normally can be realized to better than 1 percent. The final sheet resistance $r$, however, also depends upon $p$, $t_0$ and $K_r$, which are all fixed in the initial deposit. Thus, the best tolerance on $r$ is about 5 percent due, mainly, to the problem of controlling $p$ and $t_0$ precisely. If it is chosen instead to anodize the resistor film to a precise value, then V depends on $t_0$, $p$ and K so that the best tolerance on $t_c$— and hence $c$—is about 5 percent. Obviously, the frequency response is not finely controlled in either case, It is possible to choose V in a given structure to produce a desired RC product with a 1 percent tolerance by calculations based on advance measurements of $t_0$ and $p$. However, the final RC product will still be inexact owing to the slight variations of $K_c$, $\epsilon$ and $K_r$ from film to film. Further, the impedance level may be off by about 5 percent, which can be critical in a given structure when the effects of load and source impedance are considered.

An obvious possible solution would be to produce a structure in which the tantalum resistive film is deposited as a top, readily anodizable layer upon an intermediate dielectric. To date, however, a satisfactory such structure has not been achieved. Hence, the unsolved problem of precisely tuning a thin film distributed RC structure produced through existing technology is an obstacle to its current development and use.

This invention contemplates a basic method for precise frequency response adjustment of a thin film distributed RC structure, and sets forth typical structures produced in accordance with the invention which exhibit the desired characteristics.

A primary object of the invention, accordingly, is to precision adjust the frequency response of a distributed RC thin film structure in which the resistive film is inaccessibly disposed on a substrate beneath a dielectric and a counterelectrode.

A further object of this invention is to produce a thin film distributed RC structure having a very precisely tuned frequency response.

In accordance with this invention, adjustment of the frequency response of such a structure is achieved, broadly, by a controlled trim anodizing of selected portions of the underlying resistor film through accesses in the conductive counterelectrode.

The basic structure to which the inventive method is applicable comprises, for example, an anodizable resistor film on an inert substrate, a dielectric film formed by anodization of the upper portion of the resistor film and a conducting counterelectrode with holes in it disposed on top of the dielectric film. Typically, aluminum is preferred for the counterelectrode.

In accordance with one aspect of this invention, counterelectrode holes are placed to produce an anodization current path such that the resulting percentage change in resistance far exceeds the percentage change in the area of the holes. The missing counterelectrode material thus does not seriously affect the overall performance of the distributed network.

Further objects of the invention and its salient features will be evident in the description to follow of a method and structures illustrative thereof and in the drawing in which.

Figure 1:
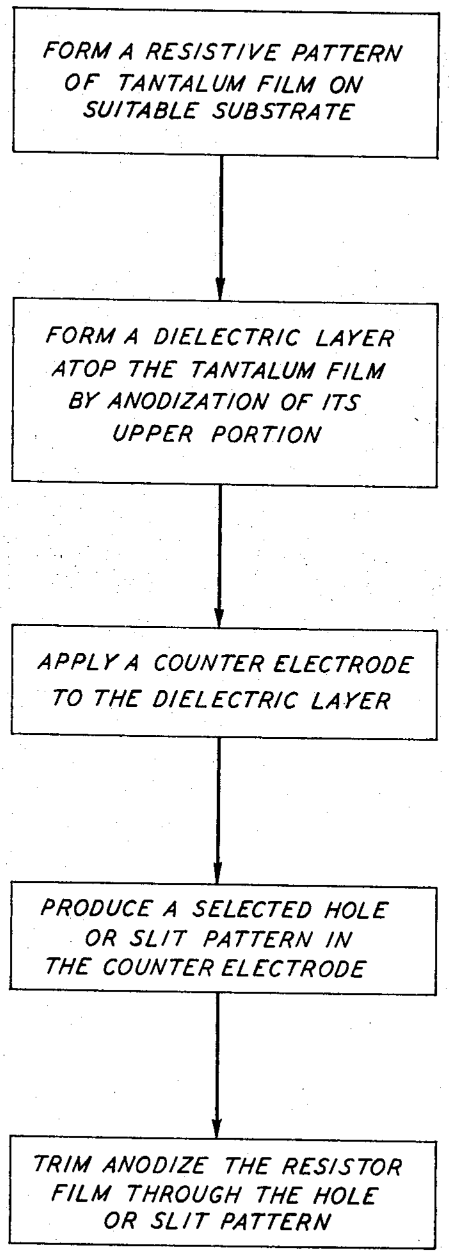
FIG. 1 is a flow chart broadly illustrating the process aspect of the invention.
Figure 2:
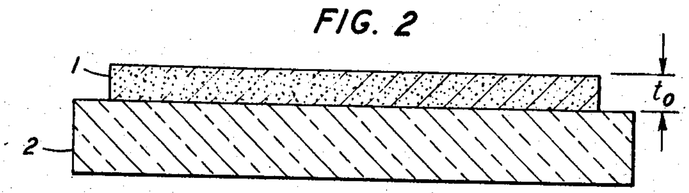
FIGS. 2–7 and 9 are schematic representations of the structure at various stages in the process.

The basic process is broadly charted in FIG. 1. First, a resistive layer of tantalum designated 1 in the drawing is deposited on a suitably prepared substrate surface 2 as seen in FIG. 2 by sputtering techniques well known in the art. Other refractory metals including niobium, titanium, zirconium, vanadium, tantalum, tungsten, and molybdenum may also be used; but tantalum yields especially stable components and its high anodizability facilitates precision adjustments. Suitable substrate materials typically are glass, ceramic or sapphire. Pursuant to the invention, the tantalum layer or film is deposited to a known thickness such as 1500 A., to establish a known $t_o$.

Figure 3:
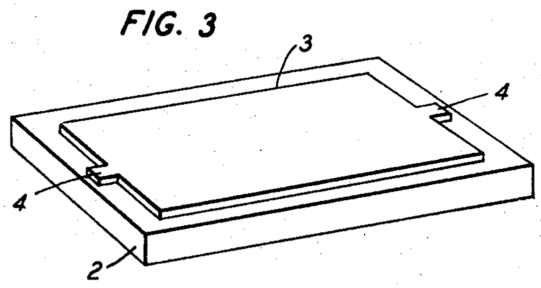

Next, a resistive pattern is generated which could be square, oblong, or a meandering path depending on the final RC product desired. By conventional photoetching techniques, a photoresist is applied to the top surface of film 1 and the desired pattern is exposed through a photomask. Developing the photoresist removes it from areas that were not masked, and in the ensuing etching process the tantalum in these areas is removed down to the substrate 2. A satisfactory etchant is hydrofluoric acid. The remaining photoresist is then removed. The resulting illustrative resistive pattern 3 is shown in FIG. 3.

At this point it is desirable to mask out the area defining the distributed RC network using, for example, a silk screen process which applies a grease such as Apiezon T grease to a terminal area, designated 4.

Figure 4:
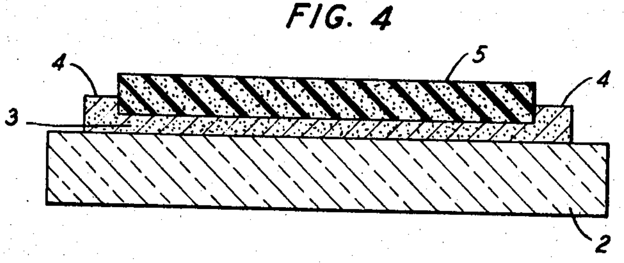
Figure 5:
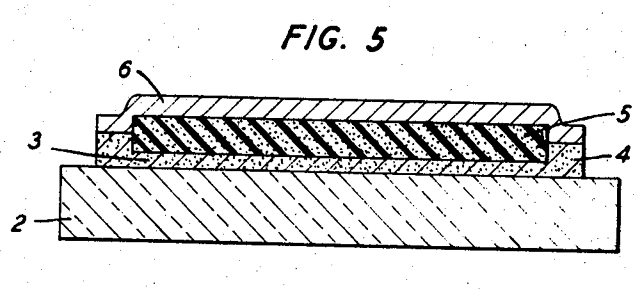

Next, the structure is immersed in an anodizing solution such as .01 percent citric acid and anodization current is applied so as to produce an oxide layer 5 on the resistive portion of the network. The buildup rate of the oxide layer 5 desirably is contant and the final thickness of layer 5 is about 2000 A., depending on the capacitance density desired. The sub-steps of back-etching and reanodizing, which remedies minor defects in the basic anodizing, can be included at this point. At the end of this step the structure is cleaned to remove the grease earlier applied to the terminals. The resulting structure is seen in FIG. 4.

The structure next is placed in an evaporator where a metallic coating is applied, advantageously, a coating of aluminum about 5000 A. thick. The coating, designated 6, advantageously is applied to the entire exposed surface of dielectric layer 5 and to the terminal ends 4 of the tantalum resistive layer. Aluminum is preferred because its high conductivity and low sensitivity to changes in relative humidity are helpful. Further, the holes shortly to be described can be etched therein without unduly affecting the underlying tantalum or tantalum oxide films. If desired, a small amount (less than 200 A.) of a more adherent material, such as titanium or nicrome can precede the aluminum.

Figure 6:
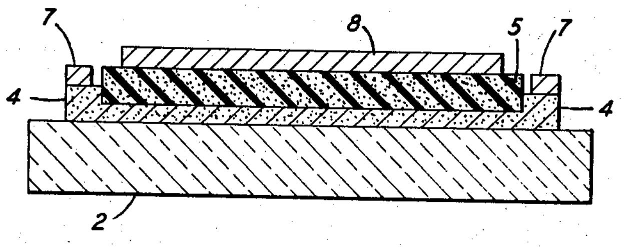

Now, a pattern is generated in the coating 6 to define the terminals 7 of the structure and also to define the counterelectrode 8. The process may be the same as described earlier for the generation of the resistor pattern. A suitable etchant is sodium hydroxide. The resulting structure, seen in FIG. 6, electrically separates the terminals 7 and the counterelectrode 8.

Figure 7:
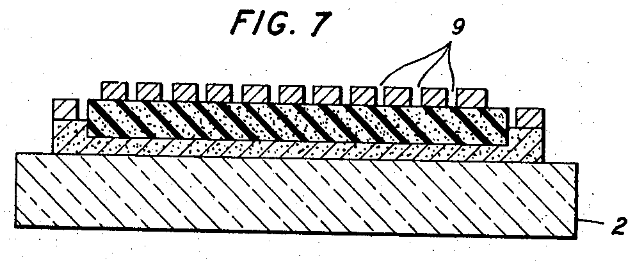

In accordance with an important aspect of the invention, a pattern of small apertures—for example, holes or slits—are now generated in the aluminum counterelectrode 8. A photoresist first is applied to the top surface of counterelectrode 8. A mask defining a hole pattern is overlaid and the photoresist exposed and developed. The hole pattern, such as illustrated in FIG. 7, is etched through. The etchant must attack the aluminum but not the underlying layer 5 of dielectric. A dilute solution of sodium hydroxide will suffice. When this is complete the remaining photoresist is removed.

It should be noted that etching of the terminals 7, counterelectrode 8, and pattern of apertures 9 could be accomplished in a single step if the photomask used includes the pattern details for each of these parts.

Figure 8:
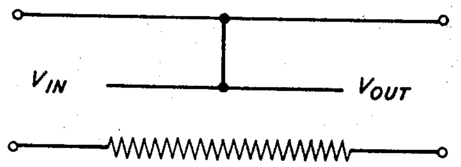
FIG. 8 is a schematic of an electrical equivalent circuit.

The frequency response of the network is next measured, for example, in terms of output voltage/input voltage vs. frequency; or in terms of phase difference between output and input vs. frequency. The schematic notation for the structure seen in FIG. 7, on which the measurements are performed, is shown in FIG. 8.

Figure 9:
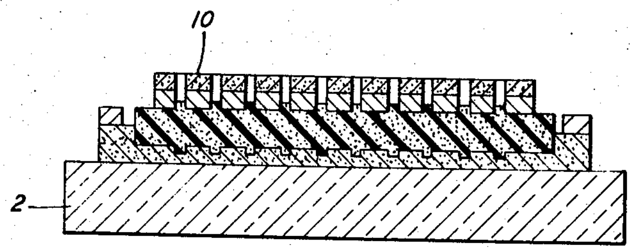

As the frequency response in all likelihood will not be exactly that desired at a given frequency, the invention now calls for anodizing the underlying tantalum resistive layer 3, through the holes 9 in the counterelectrode 8. The anodizing solution must be capable of anodizing not only the areas of resistive layer 3 under the holes, but also the top surface of the counterelectrode 8. This is shown in FIG. 9, and designated 10. Anodization advances until the frequency response measured corresponds to that desired. The choice of level for the anodization voltage in this final step will depend upon the frequency response sought. For example, suppose that when $\omega RC$ is approximately equal to 20, $V_{out}$ is 180° out of phase with $V_{in}$. The tuned condition might be that the 180° phase shift shall occur at a particular design frequency. Thus, while monitoring the phase shift for a signal with the design frequency, the anodization would proceed until the 180° phase shift condition was satisfied. The adjustment procedure increases the effective RC product of the structure. Thus, the structure would initially be fabricated so that the RC product was always below the design value before the device was adjusted.

The choice of shape and distribution of the holes is important. If the total hole area in the counter electrode is finely divided and uniformly distributed, the difference in performance from a completely distributed network will be negligible.

Figure 10:
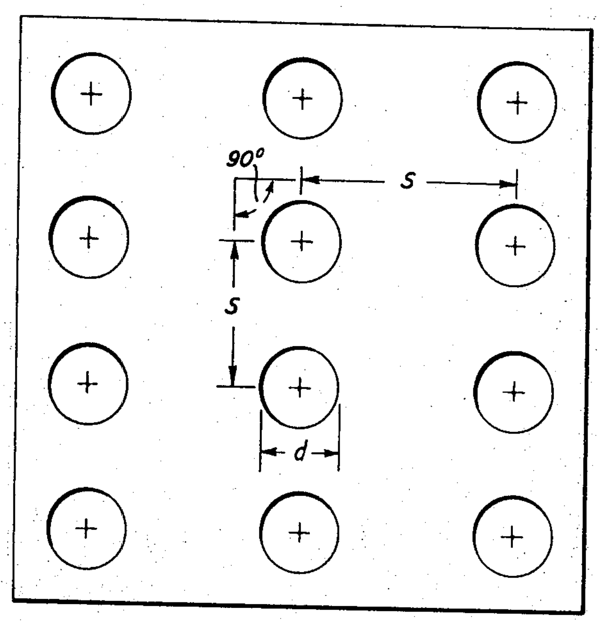
FIGS. 10–13 are schematic diagrams of various aperture patterns.

In a square array of small holes as shown in FIG. 10, the relation between the hole diameter $d$ and the hole spacing $s$ for a total hole area of, for example, 10 percent (to effect a 10 percent change in resistance) is $$\frac{\pi d^2}{4}=0.1s^2$$

Consequently, for the square array, $s=2.8\ d$.

Figure 11:
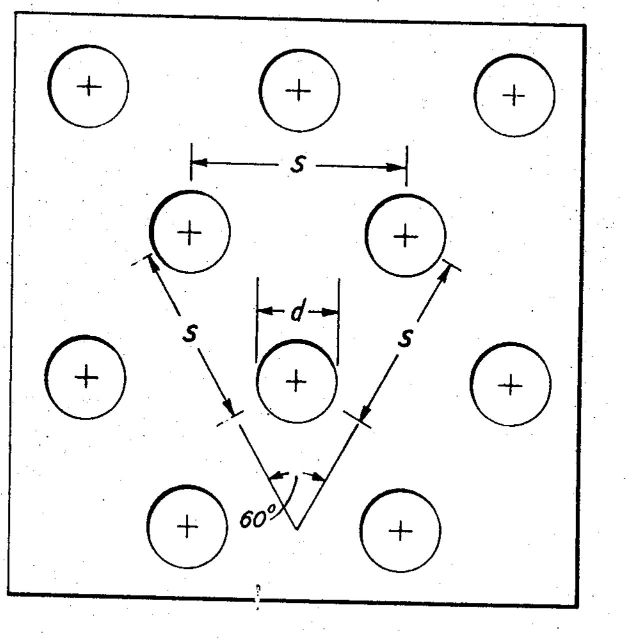

For the triangular array of FIG. 11, the relation for total hole area is $$s=3.0\ d$$

In practice, a total hole area of 10 percent allows a resistance change of from 15 percent to 30 percent because the holes in addition to reducing the average width of the path also distort the local current density. In order that the structure performance be the same as one without apertures, it is desirable that $s$ be small compared to the width of the resistive path.

Figure 12:
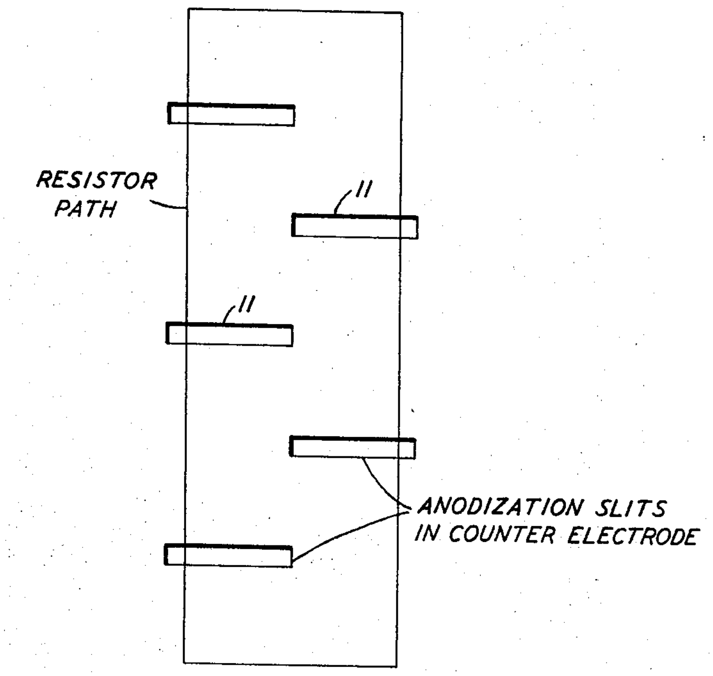

With strategic placement of the anodization apertures 9, it is possible to deflect the current path in such a manner that the resulting percentage change in resistance far exceeds the percentage area of the nubs. As illustrated in FIG. 12, apertures are in the form of narrow slits 11 whose lengths are about half the resistor path width. Slits 11 appear at regular intervals on alternate sides of the resistor. As the resistor film is anodized in the region of the slits, more and more current is diverted into a meandering path and hence the resistance increases. With the slit arrangement shown, the resistance change in the film resistor for anodizing all the way through is about 100 percent. The percentage area used for slits can be small, i.e., 5 percent for a 10 mil path width and a .5 mil slit width.

Other slit arrangements are, of course, possible. By lengthening the slits and placing them closer together, the resistance may be varied by more than an order of magnitude where necessary.

Pursuant to a further aspect of the invention, a counterelectrode hole pattern can be used to insert a large number of small series resistances at closely spaced intervals along the path of the distributed network. Adjustment may then be achieved by anodizing these resistors to increase the total path resistance. Since anodizing all the way through to the substrate would open the resistor path, adjustment would stop considerably short of that point.

Figure 13:
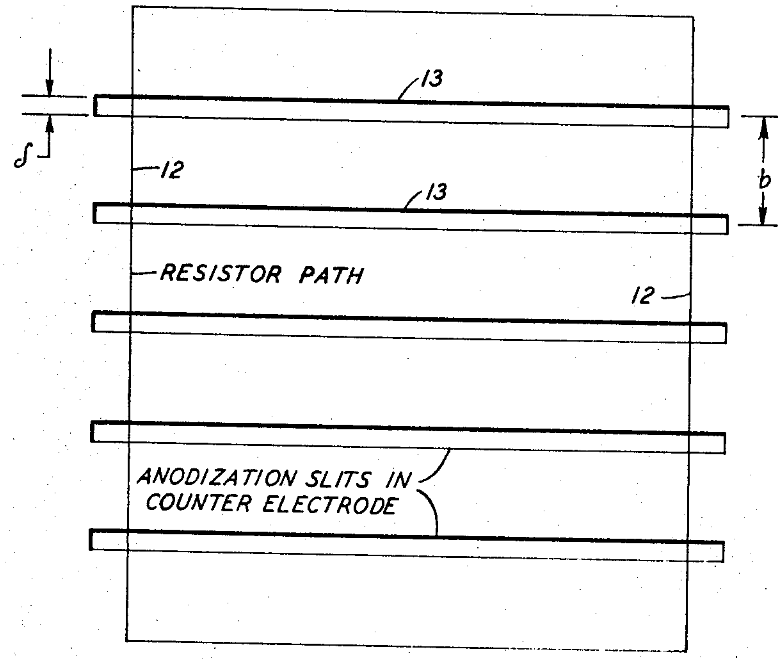

An example of the insertion of series resistance is shown in FIG. 13. The individual resistors designated 12 are formed by slits 13 of width $\delta$ in the counterelectrode extending all the way across the resistor path. The slits are perpendicular to the path with a slit interval, $b$. If it is assumed that the maximum allowed trim anodization will halve the thickness of the resistor film, adjustment of total path resistance provided by the slits is $$\frac{\Delta R}{R}=\frac{\delta}{b}$$

The greater the number of slits, the more distributed the inserted resistance is and hence the closer the network will come to the predicted performance. Thus it is desirable to have narrow, closely spaced slits such that, $$b \ll m$$

where $m$ is the length of the resistor path. If the slit width is 0.5 mil and the slit spacing is 5 mils, a 10 percent adjustment will be available. If the path is 0.5 inch or longer, the network performance should be close to the theoretical performance of a uniformly distributed RC segment.

The use of slits to insert series resistance in this manner has an advantage over the other hole configurations in that the sheet resistance and capacitance density—and hence current density—are uniform across the width of the path.

In summary, a basic method is disclosed for adjusting the frequency response of a distributed RC thin film network that overcomes the inherent severe limitations imposed by the structures themselves. Several alternate counterelectrode structures useful in practicing this method are shown. It is to be understood that the invention as defined in the claims to follow is not limited to the embodiments discussed, which are purely illustrative; but rather is intended to cover also the many obvious modifications and variations that will occur to those skilled in the art.

What is claimed is:

1. In a process for adjusting the frequency response of a thin film distributed RC network comprising a substrate, an anodizable resistive film thereon, an anodized dielectric layer covering the resistive film and a counterelectrode covering the dielectric layer, the steps of: exposing discrete portions of said dielectric layer by generating a pattern of apertures through the counterelectrode, and locally trim-anodizing the resistive film underlying the apertures and the dielectric layer.

2. The process of claim 1, wherein the aperture pattern generated in the counterelectrode is a uniform distribution of holes occupying up to 30 percent of the total area of the counterelectrode.

3. The process of claim 1, wherein the aperture pattern generated in the counterelectrode is a series of slits normal to the resistive film length and spaced on alternate sides of the path, the slits occupying up to 30 percent of the total counterelectrode area.

4. The process of claim 1 comprising the further step of monitoring the network frequency response during anodization and terminating the anodization when a selected frequency response is reached.

5. A process for producing a thin film distributed RC network having a finely adjusted frequency response comprising the steps of:

depositing upon a substrate a resistive film to a predetermined thickness, generating a resistor pattern in the film, anodizing the resistor to produce a dielectric oxide layer thereon, evaporating onto the oxide layer a metallic coating comprising a counterelectrode, generating an aperture pattern through the counterelectrode, anodizing the resistive film underlying the apertures, monitoring the network frequency response during anodization, and terminating the anodization when a selected frequency response is reached.

6. A process in accordance with claim 5, wherein the resistive film deposited upon the substrate is selected from the group consisting of niobium, titanium, zirconium, vanadium, tantalium, tungsten, and molybdenum.

7. A process in accordance with claim 7, wherein the resistive film is tantalum.

8. A process in accordance with claim 5, wherein the metallic coating comprises aluminum.

9. A process pursuant to claim 5 wherein the step of anodizing the resistive film underlying the apertures is accomplished with an etchant capable of also anodizing the counterelectrode.

10. The process of claim 1 wherein the aperture pattern comprises a series of parallel slits extending widthwise across said counterelectrode, each slit end extending beyond the corresponding edges of said resistive film, and wherein said anodizing step generates in said film a plurality of small resistances comprising the unanodized portions thereof connected in series by the anodized portions.

References Cited

UNITED STATES PATENTS

| | | | |
|---|---|---|---|
| 3,033,959 | 5/1962 | Flanagan | 29—625 |
| 3,169,892 | 2/1965 | Lemelson | 29—620 X |
| 3,266,005 | 8/1966 | Bulde et al. | |
| 3,387,952 | 6/1968 | La Chapelle | 156—7 |

JOHN F. CAMPBELL, Primary Examiner

R. W. CHURCH, Assistant Examiner

U.S. Cl. X.R.

29—25.42, 593, 620, 621, 625; 156—3; 204—38; 317—258; 333—70, 73; 338—108